United States Patent [19]

Chiba

[11] Patent Number: 5,102,820
[45] Date of Patent: Apr. 7, 1992

[54] MANUFACTURING METHOD FOR SEMICONDUCTOR MEMORIES

[75] Inventor: Atsushi Chiba, Tokyo, Japan

[73] Assignee: Oki Electric Industry Co., Ltd., Tokyo, Japan

[21] Appl. No.: 722,675

[22] Filed: Jun. 28, 1991

[30] Foreign Application Priority Data

Jun. 29, 1990 [JP] Japan .................................. 2-169828

[51] Int. Cl.$^5$ .................. H01L 21/265; H01L 21/70; H01L 21/00
[52] U.S. Cl. ........................................ 437/52; 437/48; 357/23.6
[58] Field of Search ............ 437/919, 48, 47; 357/23.6, 51; 365/145, 146, 172

[56] References Cited

U.S. PATENT DOCUMENTS 5,049,957 11/1991 Inoue et al. ........................... 437/52

FOREIGN PATENT DOCUMENTS 0243573 9/1989 Japan .................................. 437/52
0265556 10/1989 Japan .................................. 437/52

OTHER PUBLICATIONS

Inoue et al., "A Spreadstacked Capacitor (SSC) Cell for 64 Mbit DRAMs", IEDM, 1989 IEEE, pp. 2.3.1 to 2.3.4.
"A New Stacked Capacitor Cell with a Storage Node Having a Thin Box Structure", by S. Inoue et al., Toshiba Co., 21st SSDM (Solid State Devices and Materials), 1989, pp. 141-144.

Primary Examiner—Olik Chaudhuri
Assistant Examiner—Loc Q. Trinh
Attorney, Agent, or Firm—Wenderoth, Lind & Ponack

[57] ABSTRACT

In a manufacturing method for a dynamic random access memory with box-structured memory cells is disclosed, a polysilicon side wall is again formed inside the polysilicon side wall forming the outer wall. After that, with the side wall formed on this inner wall used as mask, an opening for forming a cavity is made in the center of the storage node in a self-aligned manner.

12 Claims, 3 Drawing Sheets

MANUFACTURING METHOD FOR SEMICONDUCTOR MEMORIES

CROSS REFERENCE TO RELATED APPLICATION

This application claims the right of priority under USC 119 of Japanese Patent Application No. 02-169828, filed on June 29, 1990.

BACKGROUND OF THE INVENTION

1. Field of the Invention

This invention relates to a method for manufacturing a dynamic random access memory, specifically, to a semiconductor device having stacked memory cells.

2. Description of the Related Art

In dynamic random access memories employing stacked capacitor cells, various kinds of memory cell structure have been suggested to increase the capacitance value of the storage electrodes. One example is the box-structured memory cell disclosed in "A New Stacked Capacitor Cell with a Storage Node Having a Thin Box Structure", by S. Inoue et al., Toshiba Co., 21st SSDM (Solid State Devices and Materials), 1989, p141-144. This memory cell can provide a large capacitance per narrow area. This type memory cells require the step of forming a cavity inside the storage node or electrode of the capacitance cell. However, it has been very difficult to obtain well-patterned cavity using ordinary photolithography. This is because there is a large level difference between the storage node and the substrate, whereby it is difficult to perform uniform resist coating.

SUMMARY OF THE INVENTION

An object of the invention is to provide a method for manufacturing readily memory cells with higher integration and larger capacitance.

The method for manufacturing box-structured memory cells according to this invention comprises the steps of: (a) forming a first insulating film on a surface of a silicon substrate and then forming a second insulating film made of a different kind of material from that of the first insulating film as an upper layer of the first insulating film; (b) forming a contact hole in predetermined regions of surfaces of the first and second insulating films so as to expose the silicon substrate; (c) filling the contact hole to form a first conductive film extending over the second insulation film; (d) forming a third insulating film made of a different kind of material from that of the second insulating film on the upper part of the first conductive film; forming a second conductive film as an upper layer of the third insulating film; and then forming a fourth insulating film made of a different kind of material from that of the second insulting film on the second conductive film, whereby a first multilayered film composed of four films of the first conductive film, the third insulating film, the second conductive film, and the fourth insulating film is formed; (e) removing the first multilayered film by etching over the region except that covering the contact hole and its circumference; (f) forming a first conductive side wall on the side wall of the multilayered film that has been left unetched; (g) after formation of the first side wall, removing the fourth insulating film to expose the second conductive film and the inner wall of the first side wall; forming a third conductive film on the first side wall and the exposed second conductive film; and forming a second conductive side wall inside and outside the first side wall by anisotropic etching; (h) etching the second conductive film by applying anisotropic etching using the inner second side wall as a maskan opening part to form the second conductive film, (i) removing the third insulating film exposed through the opening to form a storage node; and (j) forming a dielectric film on the surface of the storage node and a conductive film on the surface of the dielectric film.

The first multilayered film may be composed of five or more insulating or conductive films. The first side wall is formed by anisotropic etching after forming a conductive film on the upper part and the sides of the multilayered film.

DETAILED DESCRIPTION OF THE PREFERRED EMBODIMENT

Figure 1A:
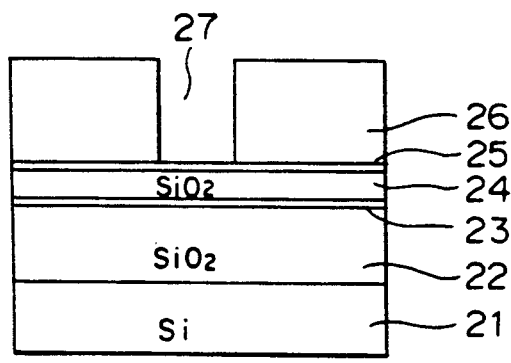
FIGS. 1(a) to 1(h) show cross-sectional views showing manufacturing steps of an embodiment of this invention.

As shown in FIG. 1a, an $SiO_2$ film (22) is formed on a silicon substrate by a known thermal oxidation or Atmosphere Pressure Chemical Vapor Deposition (hereafter abbreviated APCVD), and an SiN film (23) is formed on the $SiO_2$ film by a known Low-Pressure Chemical Vapor Deposition (hereafter abbreviated LPCVD).

This SiN film (23) is covered with an $SiO_2$ film (24) formed using the APCVD method and further with an SiN film (25) formed using the LPCVD method. Resist (26) is applied to the surface of this SiN film (25) and further subjected to a prescribed patterning by photography. Subsequently this patterned resist (26) is used as a mask to etch the $SiO_2$ film (22), SiN film (23), $SiO_2$ film (24), and SiN film (25) and open a contact hole (27).

Figure 1B:
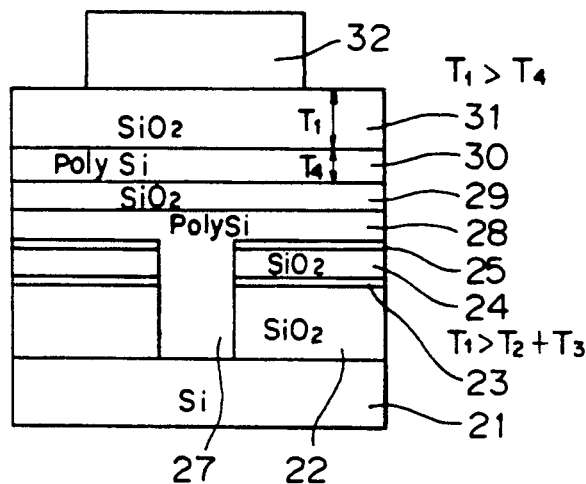

Next, as shown in FIG. 1(b), a polysilicon film (28) is formed by the LPCVD method to fill the contact (27) and to make a contact with the substrate (21). This film (28) is covered, by the LPCVD method, with an $SiO_2$ film (29), which is successively laminated with a polysilicon film (30) formed by the LPCVD method and an $SiO_2$ film (31) formed by the APCVD method. This film (31) is formed in a thickness T1 larger than the sum of the film thickness T2 of the polysilicon film (33A) shown in FIG. 1(c) and the film thickness T3 of the polysilicon film (33B) shown in FIG. 1(d)—in other words, in such a manner that $T1 > T2 + T3$ and the film thickness T4 of the underlying polysilicon film (30) satisfies the inequality: $T1 > T4$. After that, resist (32) is applied to the $SiO_2$ film (31) and is patterned as prescribed.

Figure 1C:
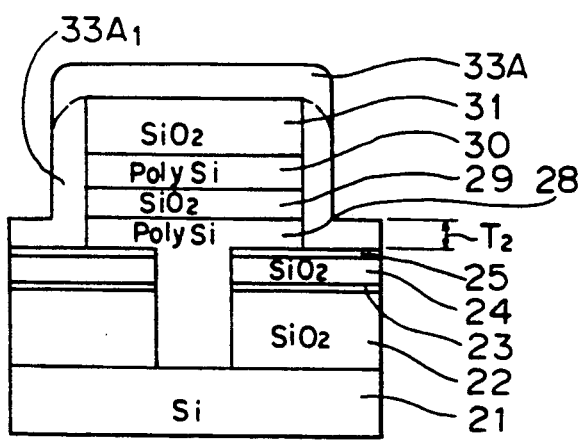

Next, as shown in FIG. 1(c), a polysilicon film (28), an $SiO_2$ film (29), a polysilicon film (30), and an $SiO_2$ film (31) are etched using the resist (32) as a mask.

Figure 1D:
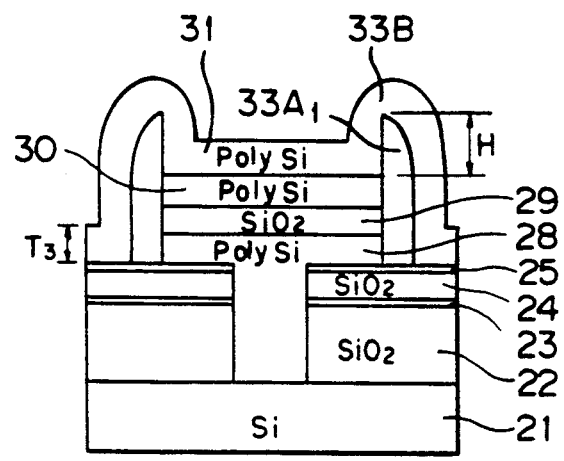

Then, a polysilicon film (33A) with a thickness of T2 is once formed on the whole area of the substrate and etched by known Reactive Ion Etching (hereafter abbreviated R.I.E.) to leave a polysilicon side wall (33A1) as shown in FIG. 1(d). Further the $SiO_2$ film (31) is removed using an aqueous solution having a fluoric acid base. The height H of the side wall (33A1) over the polysilicon film (30) is substantially equal to the film thickness T1 of the $SiO_2$ film (31).

Figure 1E:
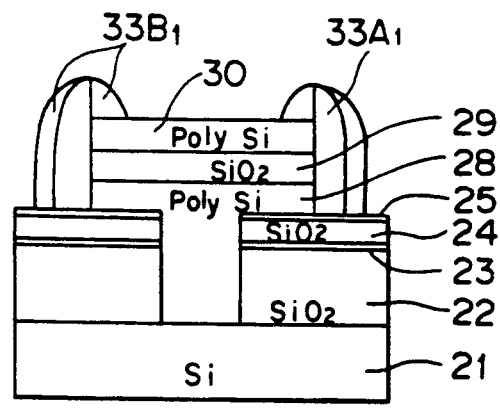

A polysilicon film (33B) with a thickness T3 is formed over the whole area and etched by the RIE method to leave a polysilicon side wall (33B1) as is shown in FIG. 1(e).

Figure 1F:
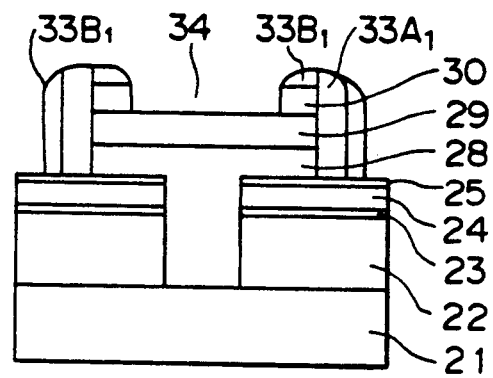

Next, as shown in FIG. 1(f), the polysilicon film (30) is etched by the RIE method using the polysilicon side wall (33B1) as a mask to open a cavity (34). The position of this cavity (34) is determined by the inner side wall (33B1), which is formed inwardly from the outer side wall (33A1). This process etches both the polysilicon side wall (33A1) and the polysilicon side wall (33B1). But, as stated above, the height H of the polysilicon side wall (33B1) is approximately equal to the film thickness T1 of the oxide film (31), which is thicker than the film thickness T4 of the polysilicon film (30). For this reason, when the etching of the polysilicon film (30) is completed, the side walls (33A1 and 33B1) remain.

Figure 1G:
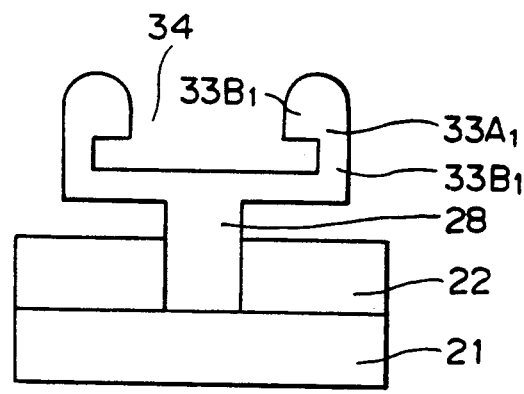

After this cavity (34) is opened, the SiN film (25) is removed by etching as shown in FIG. 1(g), and then two SiO$_2$ films (22 and 24) are removed by etching using an aqueous solution based on fluoric acid. Furthermore, the SiN film (23) is removed by etching.

Figure 1H:
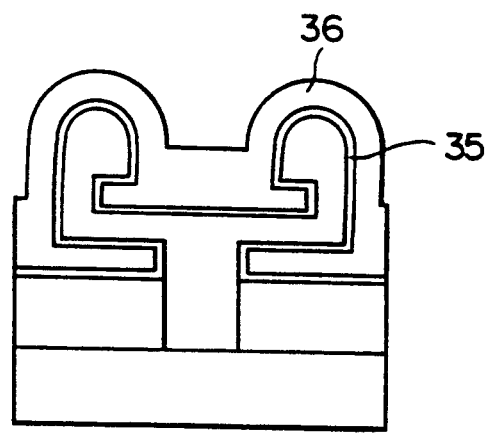

As is shown in FIG. 1(h), a capacitor Ta$_2$O$_5$ dielectric film (35) is formed over the entire surface according to the ordinary method, and in addition, it is covered with a conductive film (36) formed by the LPCVD method. The above processes complete a box-structured memory cell.

What is claimed is:

1. A method for manufacturing memory cells comprising the steps of:
    (a) forming a first insulating film on a surface of a silicon substrate and then forming a second insulating film made of a different kind of material from that of the first insulating film as an upper layer of the first insulating film;
    (b) forming a contact hole in a predetermined regions of the first and second insulating films so as to expose a surface of the silicon substrate;
    (c) filling the contact hole to form a first conductive film extending over the second insulation film;
    (d) forming a third insulating film made of a different kind of material from that of the second insulating film on the first conductive film; forming a second conductive film as an upper layer of the third insulating film; and then forming a fourth insulating film made of a different kind of material from that of the second insulating film on the second conductive film, whereby a first multilayered film composed of four films of the first conductive film, the third insulating film, the second conductive film and the fourth insulating film is formed;
    (e) removing the first multilayered film by etching over the region except that portion which covers the contact hole and its circumference,
    (f) forming a first conductive side wall on the side wall of the multilayered film which has been left unetched;
    (g) after formation of the first side wall, removing the fourth insulating film to expose the second conductive film and the inner wall of the first side wall; and then forming a third conductive film on the first side wall and the exposed second conductive film; and then forming a second conductive side wall inside and outside the first side wall by anisotropic etching;
    (h) performing anisotropic etching to the second conductive film using the inner second side wall as a mask to form an opening part;
    (i) removing the third insulating film exposed through the opening to form a storage node; and
    (j) forming a dielectric film on the surface of the storage node and forming a conductive film on the surface of the dielectric film.

2. A method according to claim 1, wherein the step (a) comprises forming a fifth insulating film made of the same kind of material as that of the first insulating film as an upper layer of the second insulating film; forming a sixth insulating film made of the same kind of material as that of the second insulating film as an upper layer of the fifth insulating film; forming a contact hole in the prescribed regions of the first and second insulating films and the fifth and sixth insulating films so as to expose the silicon substrate; and wherein the step (i) comprises removing the sixth insulating film; simultaneously removing the third and fifth insulating films to form a storage node; forming a dielectric film on the surface of the storage node; and then forming a conductive film on the surface of the dielectric film.

3. A method according to claim 1, wherein the side wall is formed by anisotropic etching after a conductive film is formed on the upper part and side part of the first multilayered film.

4. A method according to claim 1, wherein the insulating film has a thickness T1 greater than 1.5 times the thickness T4 of the second conductive film.

5. A method according to claim 1, wherein the film has a thickness T1 greater than the sum of the thickness T2 of the first side wall and the thickness T3 of the third conductive film.

6. A method according to claim 1, wherein the multilayered film remaining unetched in the step (f) has a shape of a polygonal pole.

7. A method according to claim 1, wherein the multilayered film remaining unetched in the step (f) has a shape of a cylindrical pole.

8. A method according to claim 1, wherein the opening is formed so that its position is determined by the internal second side wall.

9. A method according to claim 1, wherein the dielectric film is of Ta$_2$O$_5$.

10. A method according to claim 1, wherein the dielectric film has a three-layered structure composed of an SiO$_2$ film, an SiN Film, and an SiO$_2$ film, all overlapping one another.

11. A method according to claim 1, wherein the storage node is made of polysilicon doped with impurities.

12. A method according to claim 11, wherein the surface of the polysilicon member has many minute irregularities.

* * * * *